US011515226B2

(12) United States Patent
Ko et al.

(10) Patent No.: US 11,515,226 B2
(45) Date of Patent: Nov. 29, 2022

(54) SEMICONDUCTOR PACKAGE AND METHOD OF FABRICATING THE SAME

(71) Applicant: Samsung Electronics Co., Ltd., Suwon-si (KR)

(72) Inventors: Yeongkwon Ko, Hwaseong-si (KR); Seunghun Shin, Cheonan-si (KR); Junyeong Heo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/117,588

(22) Filed: Dec. 10, 2020

(65) Prior Publication Data

US 2021/0343613 A1 Nov. 4, 2021

(30) Foreign Application Priority Data

May 4, 2020 (KR) .................. 10-2020-0053446

(51) Int. Cl.
*H01L 23/31* (2006.01)
*H01L 25/065* (2006.01)
*H01L 23/00* (2006.01)
*H01L 23/498* (2006.01)
*H01L 21/48* (2006.01)
*H01L 21/56* (2006.01)
*H01L 21/78* (2006.01)

(52) U.S. Cl.
CPC ........ *H01L 23/3128* (2013.01); *H01L 21/486* (2013.01); *H01L 21/4853* (2013.01); *H01L 21/565* (2013.01); *H01L 21/78* (2013.01); *H01L 23/49827* (2013.01); *H01L 23/49838* (2013.01); *H01L 24/16* (2013.01); *H01L 25/0657* (2013.01); *H01L 2224/16227* (2013.01); *H01L 2225/06513* (2013.01); *H01L 2225/06541* (2013.01); *H01L 2225/06548* (2013.01); *H01L 2225/06586* (2013.01)

(58) Field of Classification Search
None
See application file for complete search history.

(56) References Cited

U.S. PATENT DOCUMENTS

| 5,119,171 | A | 6/1992 | Lesk et al. |
| 6,727,163 | B2 | 4/2004 | Kim et al. |
| 6,902,990 | B2 | 6/2005 | Gottfried et al. |
| 7,241,669 | B2 | 7/2007 | Swenson et al. |

(Continued)

FOREIGN PATENT DOCUMENTS

| CN | 1938837 A | 3/2007 |
| JP | 2002198326 A | 7/2002 |

(Continued)

*Primary Examiner* — Long Pham
(74) *Attorney, Agent, or Firm* — Harness, Dickey & Pierce, P.L.C.

(57) ABSTRACT

Disclosed are semiconductor packages and/or methods of fabricating the same. The semiconductor package comprises a substrate, a semiconductor chip on the substrate, and a molding layer. The semiconductor chip includes a circuit region and an edge region around the circuit region. The molding layer covers a sidewall of the semiconductor chip. The semiconductor chip includes a reforming layer on the edge region. A top surface of the reforming layer is coplanar with a top surface of the molding layer.

20 Claims, 24 Drawing Sheets

(56) References Cited

U.S. PATENT DOCUMENTS

| | | | |
|---|---|---|---|
| 7,642,113 | B2 | 1/2010 | Kurosawa |
| 7,754,582 | B2 | 7/2010 | Morikazu et al. |
| 7,776,720 | B2 | 8/2010 | Boyle et al. |
| 7,843,042 | B2 | 11/2010 | Kuan et al. |
| 8,053,277 | B2 | 11/2011 | Yu et al. |
| 8,426,256 | B2 | 4/2013 | Hsiao et al. |
| 10,304,817 | B2 * | 5/2019 | Lin ................ H01L 25/105 |
| 2014/0017837 | A1 | 1/2014 | Kim et al. |
| 2018/0226295 | A1 | 8/2018 | Sugiya et al. |
| 2019/0164784 | A1 | 5/2019 | Wongratanaporngoorn et al. |

FOREIGN PATENT DOCUMENTS

| | | |
|---|---|---|
| JP | 6013858 B2 | 10/2016 |
| JP | 6457231 B2 | 1/2019 |
| JP | 2019087628 A | 6/2019 |

\* cited by examiner

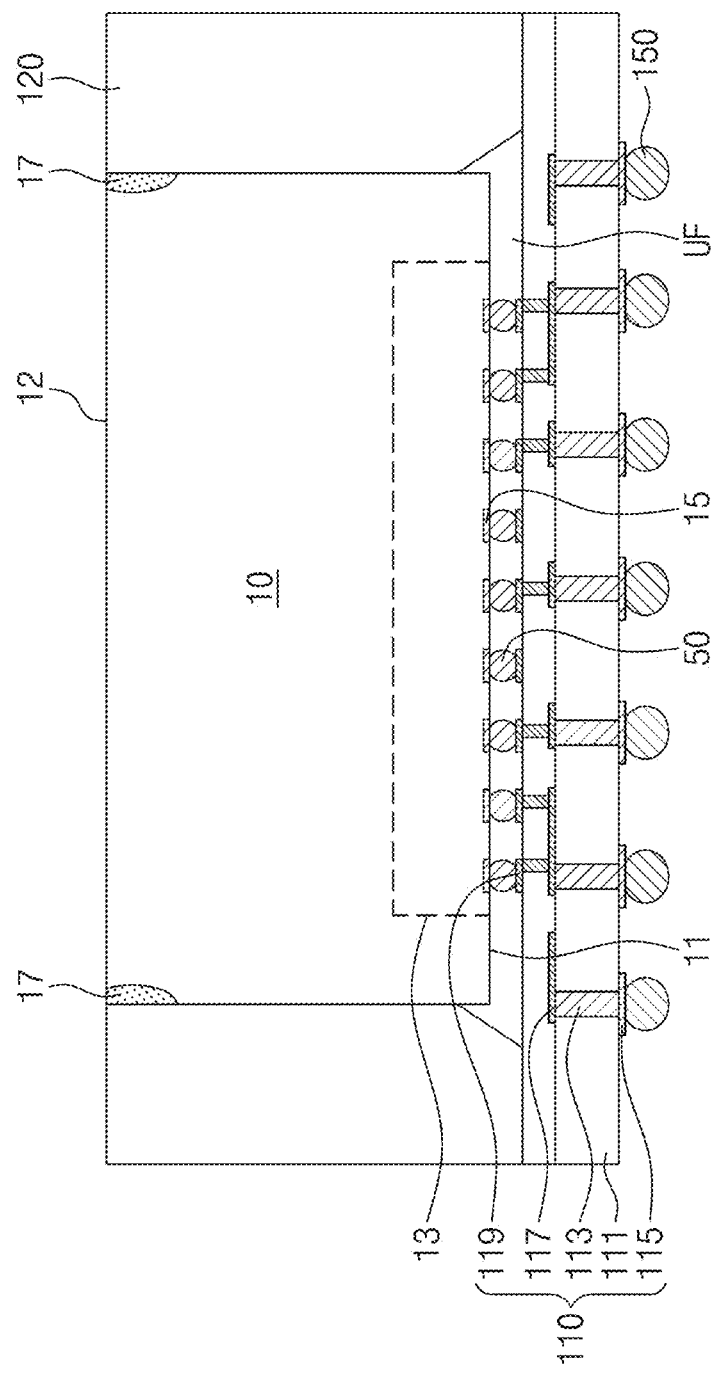

SEMICONDUCTOR PACKAGE AND METHOD OF FABRICATING THE SAME

CROSS-REFERENCE TO RELATED APPLICATION

This U.S. nonprovisional application claims priority under 35 U.S.C § 119 to Korean Patent Application No. 10-2020-0053446, filed on May 4, 2020 in the Korean Intellectual Property Office, the disclosure of which is hereby incorporated by reference in its entirety.

BACKGROUND

Inventive concepts relate to a semiconductor package and/or a method of fabricating the same, and more particularly, to a semiconductor package with increased reliability and yield and/or a method of fabricating the same.

Portable devices have been increasingly demanded in recent electronic product markets, and as a result, reducing the size and weight of electronic parts mounted on the portable devices has been desired. To accomplish the reduction in size and weight of the electronic parts, technology may be needed not only to reduce each size of mounting parts, but to integrate a number of individual devices on a single package.

SUMMARY

An embodiment of inventive concepts provide a semiconductor package with increased reliability and a method of fabricating the same.

An object of inventive concepts is not limited to the mentioned above, and other objects which have not been mentioned above will be clearly understood to those skilled in the art from the following description.

According to an embodiment of inventive concepts, a semiconductor package may include a substrate; a semiconductor chip on the substrate, the semiconductor chip including a circuit region and an edge region around the circuit region; and a molding layer on the substrate and covering a sidewall of the semiconductor chip. The semiconductor chip may include a reforming layer on the edge region. A top surface of the reforming layer may be coplanar with a top surface of the molding layer.

According to an embodiment of inventive concepts, a semiconductor package may include a package substrate; a connection substrate on the package substrate; a chip stack on the connection substrate, the chip stack including a plurality of first semiconductor chips that are vertically stacked; a second semiconductor chip on the connection substrate and spaced apart from the chip stack; and a molding layer on the connection substrate. The molding layer may cover a sidewall of the chip stack and a sidewall of the second semiconductor chip. The second semiconductor chip may include a circuit region and an edge region around the circuit region. The second semiconductor chip may include a reforming layer at a portion of a top surface thereof on the edge region. A top surface of the molding layer may be coplanar with a top surface of the reforming layer.

According to an embodiment of inventive concepts, a method of fabricating a semiconductor package may include preparing a first substrate that includes a plurality of chip regions and a scribe lane region surrounding each of the plurality of chip regions, the first substrate having a first surface opposite a second surface; performing a laser grooving process along the scribe lane region of the first substrate to form a reforming layer that surrounds each of the plurality of chip regions; cutting the scribe lane region of the first substrate to form a plurality of semiconductor chips separated from each other, each of the plurality of semiconductor chips including a corresponding portion of the reforming layer; mounting the plurality of semiconductor chips on a second substrate; forming a molding layer on the second substrate, the molding layer covering sidewalls of the plurality of semiconductor chips and top surfaces of the plurality of semiconductor chips; and performing a grinding process on the molding layer to expose the top surfaces of the plurality of semiconductor chips. The grinding process may expose the reforming layer.

Details of example embodiments are included in the description and drawings.

BRIEF DESCRIPTION OF THE DRAWINGS

FIGS. 2 and 3 illustrate cross-sectional views showing a semiconductor package according to an embodiment of inventive concepts.

DETAILED DESCRIPTION

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

The following will now describe a semiconductor package and/or a method of fabricating the same according to an embodiment of inventive concepts in conjunction with the accompanying drawings.

Figure 1A:
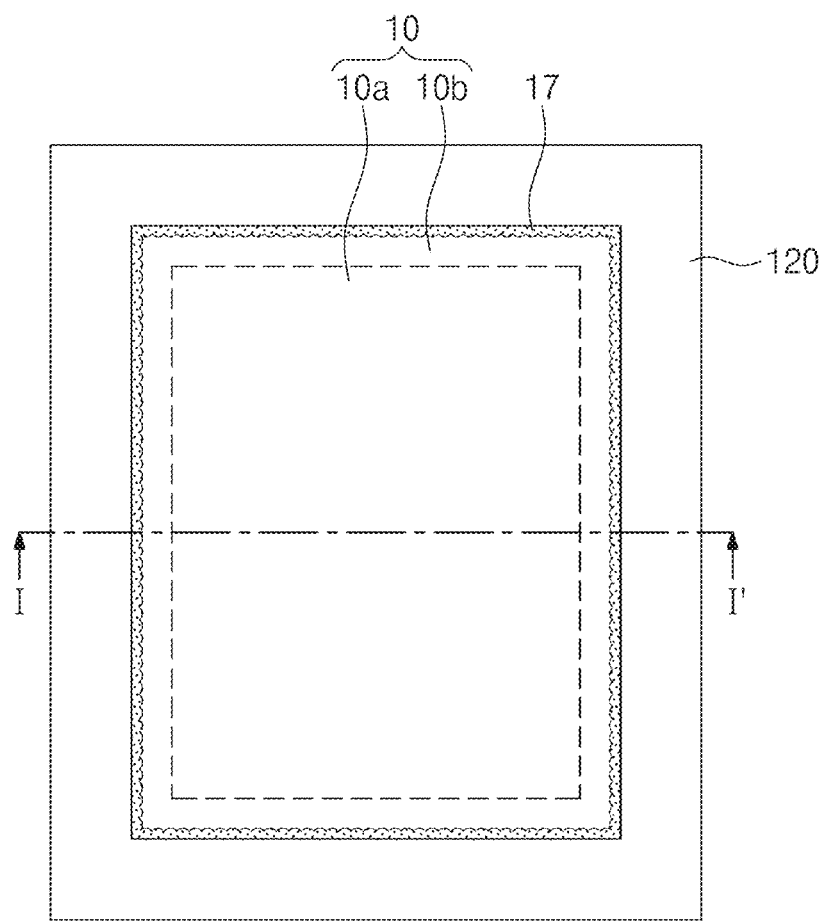
FIG. 1A illustrates a simplified plan view showing a semiconductor package according to an embodiment of inventive concepts.
Figure 1B:
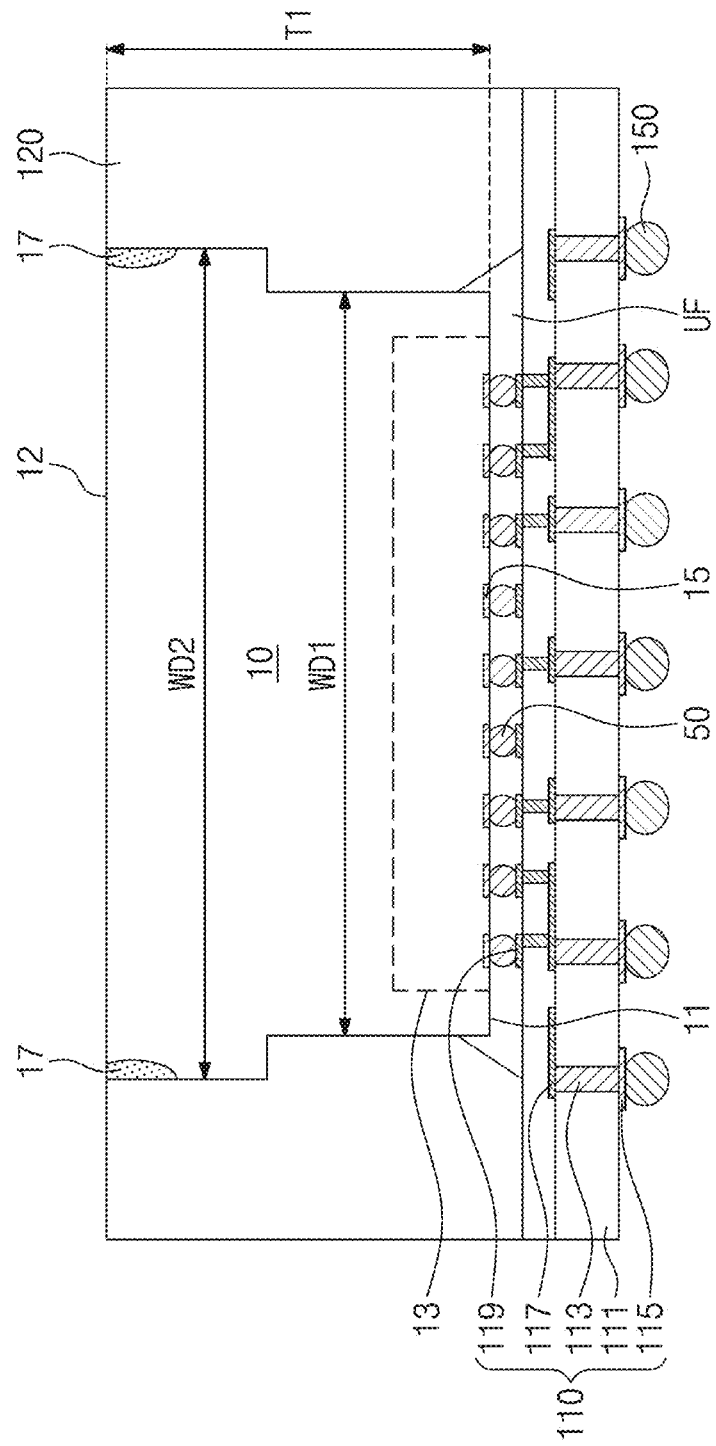
FIG. 1B illustrates a cross-sectional view taken along line I-I' of FIG. 1A, showing a semiconductor package according to an embodiment of inventive concepts.
Figure 1C:
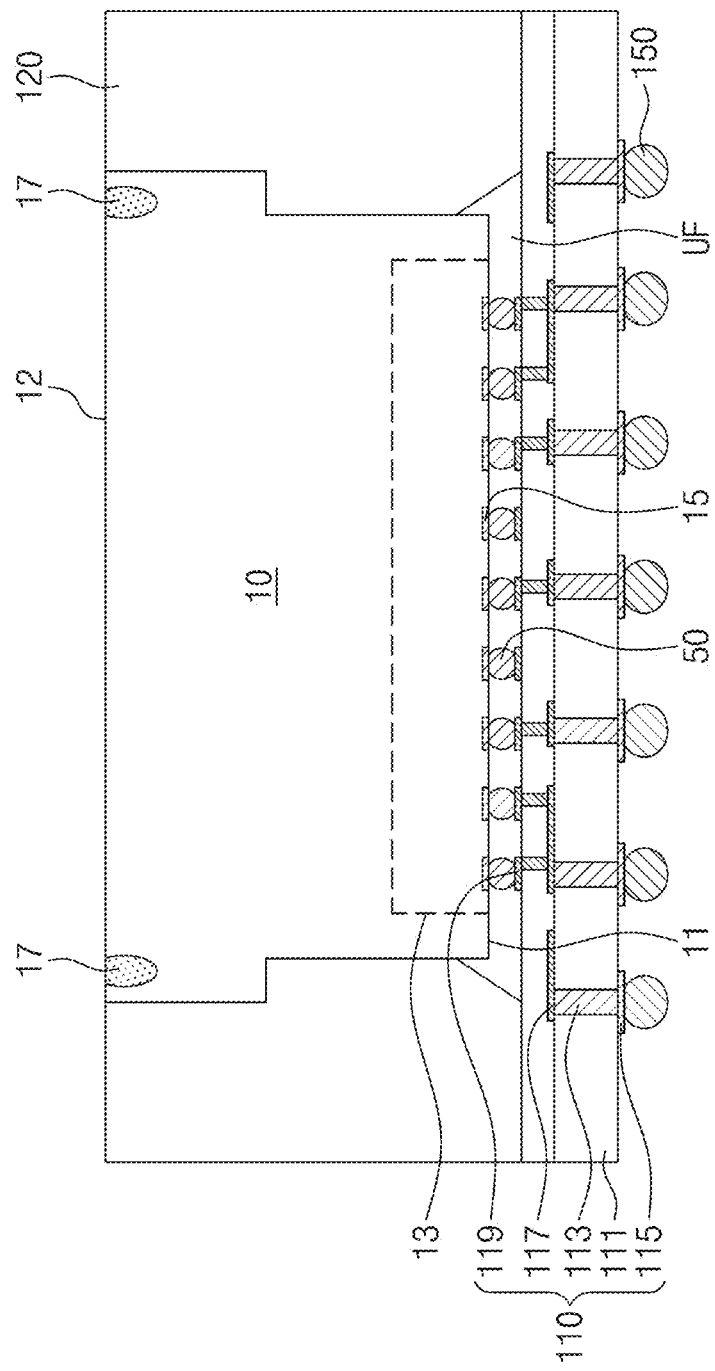
FIG. 1C illustrates a cross-sectional view showing a semiconductor package according to an embodiment of inventive concepts.

FIG. 1A illustrates a simplified plan view showing a semiconductor package according to an embodiment of inventive concepts. FIG. 1B illustrates a cross-sectional view taken along line I-I' of FIG. 1A, showing a semiconductor package according to an embodiment of inventive concepts. FIG. 1C illustrates a cross-sectional view showing a semiconductor package according to an embodiment of inventive concepts.

Referring to FIGS. 1A and 1B, a semiconductor package may include a connection substrate 110, a semiconductor chip 10, and a molding layer 120.

The connection substrate 110 may include a base substrate 111, a wiring line layer, through vias 113, connection lines 117, lower pads 115, and upper pads 119.

The base substrate 111 may be a silicon substrate or a silicon-on-insulator (SOI) substrate. Alternatively, the base substrate 111 may be a glass substrate, a ceramic substrate, a polymer substrate, or any other substrate capable of providing proper protection and/or an interconnection function. The base substrate 111 may include active electronic devices and/or passive electronic devices. A passivation dielectric layer may be disposed on each of top and bottom surfaces of the base substrate 111.

The through vias 113 may penetrate the base substrate 111, and the through vias 113 and the connection lines 117 may include a metallic material, such as tungsten (W), aluminum (Al), or copper (Cu).

The lower pads 115 and the upper pads 119 may be respectively disposed on a bottom surface and a top surface of the connection substrate 110. The lower pads 115 may be electrically connected to the upper pads 119 through the through vias 113 and the connection lines 117.

Lower connection terminals 150, such as solder balls or solder bumps, may be attached to the lower pads 115 of the connection substrate 110. The lower connection terminals 150 may each have a thickness of about 40 μm to about 80 μm.

The semiconductor chip 10 may be disposed on the connection substrate 110. For example, the semiconductor chip 10 may be a logic chip including, for example, a microelectromechanical system (MEMS) device, an optoelectronic device, a central processing unit (CPU), a graphic processing unit (GPU), a mobile application, or a digital signal processor (DSP). The semiconductor chip 10 may have a thickness ranging from about 700 μm to about 775 μm.

The semiconductor chip 10 may have a first surface 11 and a second surface 12 that are opposite surfaces of the semiconductor chip 10. For example, the first surface 11 may be a top surface and the second surface 12 may be a bottom surface 12, but is not limited thereto. The semiconductor chip 10 may have a first width WD1 at the first surface 11, and may also have at the second surface 12 a second width WD2 greater than the first width WD1. The semiconductor chip 10 may include a lower portion that is adjacent to the connection substrate 110 and has the first width WD1, and may also include an upper portion that has the second width WD2 greater than the first width WD1. In addition, the semiconductor chip 10 may have a stepwise sidewall.

The semiconductor chip 10 may include a circuit region 10a and an edge region 10b around the circuit region 10a. The semiconductor chip 10 may include semiconductor integrated circuits 13 formed on the first surface 11 on the circuit region 10a. The semiconductor chip 10 may have chip pads 15 on the first surface 11, and the chip pads 15 may be connected to the upper pads 119 of the connection substrate 110 through connection terminals 50, such as solder balls or solder bumps. For example, the connection terminals 50 may be smaller than the lower connection terminals 150. The connection terminals 50 may each have a thickness of, for example, about 30 μm to about 70 μm.

The semiconductor chip 10 may include a reforming layer 17 adjacent to the second surface 12 on the edge region 10b. The reforming layer 17 may have different physical characteristics from those of a section in the vicinity of the reforming layer 17. For example, the reforming layer 17 may have different strength from that of the section in the vicinity of the reforming layer 17. The reforming layer 17 may include, for example, amorphous silicon. For example, the reforming layer 17 may be positioned at a sidewall of the upper portion of the semiconductor chip 10, where the upper portion has the second width WD2.

For another example, referring to FIG. 1C, the reforming layer 17 may be disposed on the edge region 10b of the semiconductor chip 10 and spaced apart from a sidewall of the semiconductor chip 10. Although it is illustrated that the reforming layer 17 is symmetrically formed at opposite sidewalls of the semiconductor chip 10, the reforming layer 17 may have different sizes and/or volumes at the opposite sidewalls of the semiconductor chip 10.

The reforming layer 17 may extend along an edge of the semiconductor chip 10. The reforming layer 17 may have a top surface substantially coplanar with the second surface 12 of the semiconductor chip 10. The reforming layer 17 may cause the semiconductor chip 10 to have an uneven or crooked edge.

An under-fill layer UF may be interposed between the semiconductor chip 10 and the connection substrate 110. The under-fill layer UF may fill between the connection terminals 50. The under-fill layer UF may include, for example, a thermo-curable resin or a photo-curable resin. The under-fill layer UF may further include inorganic or organic fillers. In an embodiment, the under-fill layer UF may be omitted, and instead, the molding layer 120 may fill between the connection substrate 110 and the first surface 11 of the semiconductor chip 10.

On the connection substrate 110, the molding layer 120 may surround the sidewall of the semiconductor chip 10. The molding layer 120 may include a dielectric polymer, such as epoxy molding compound (EMC). The molding layer 120 may be thicker than the semiconductor chip 10, and may have a top surface substantially coplanar with the second surface 12 of the semiconductor chip 10. The top surface of the molding layer 120 may be coplanar with the top surface of the reforming layer 17 formed in the semiconductor chip 10. The molding layer 120 may be in contact with the sidewall of the semiconductor chip 10 and a sidewall of the reforming layer 17.

Figure 3:
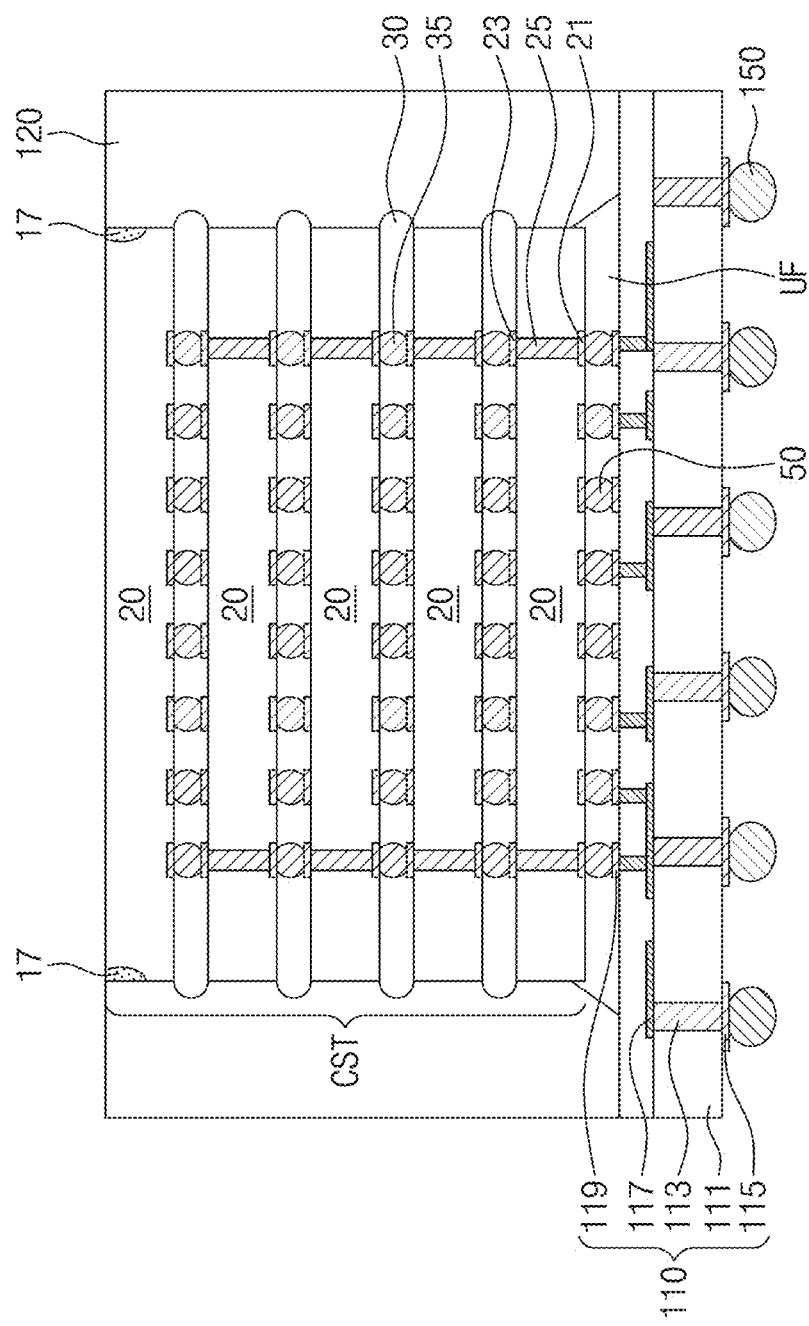

FIGS. 2 and 3 illustrate cross-sectional views showing a semiconductor package according to an embodiment of inventive concepts. In the embodiments of FIGS. 2 and 3 that follow, the same technical features as those discussed with reference to FIGS. 1A and 1B will be omitted for brevity of description, and differences thereof will be explained below.

Referring to FIG. 2, the semiconductor chip 10 may have substantially the same width at the first surface 11 and the second surface 12. For example, the semiconductor chip 10 may have a uniform width and a flat sidewall. The reforming layer 17 may be positioned along an upper edge of the semiconductor chip 10. On the edge region 10b, the reforming layer 17 may be positioned at a top surface of the semiconductor chip 10, and the top surface of the reforming layer 17 may be substantially coplanar with the top surface of the molding layer 120. In addition, the sidewall of the reforming layer 17 may be in contact with the molding layer 120.

Referring to FIG. 3, a semiconductor package may include a chip stack CST disposed on the connection substrate 110. The chip stack CST may include a plurality of memory chips 20 that are electrically connected to each other through a plurality of chip through vias 25. The memory chips 20 may be stacked on the connection substrate 110 so as to allow their sidewalls to align with each other.

Each of the memory chips 20 may include a plurality of chip through vias 25 coupled to chip pads 21 and 23. The chip stack CST may be flip-chip mounted on the connection substrate 110. The chip pads 21 and 23 of the memory chips 20 may be electrically connected to each other through connection bumps 35.

An adhesive layer 30 may be provided between the memory chips 20. The adhesive layer 30 may be, for example, a polymer tape including a dielectric material. The adhesive layer 30 may be interposed between the connection bumps 35, and thus an electrical short may be limited and/or prevented between the connection bumps 35.

According to an embodiment, an uppermost one of the memory chips 20 may include a reforming layer 17 formed along an upper edge of the uppermost memory chip 20.

On the connection substrate 110, the molding layer 120 may cover a sidewall of the chip stack CST. The top surface of the molding layer 120 may be substantially coplanar with a top surface of the uppermost memory chip 20 and with a top surface of the reforming layer 17 formed in the uppermost memory chip 20.

Figure 4A:
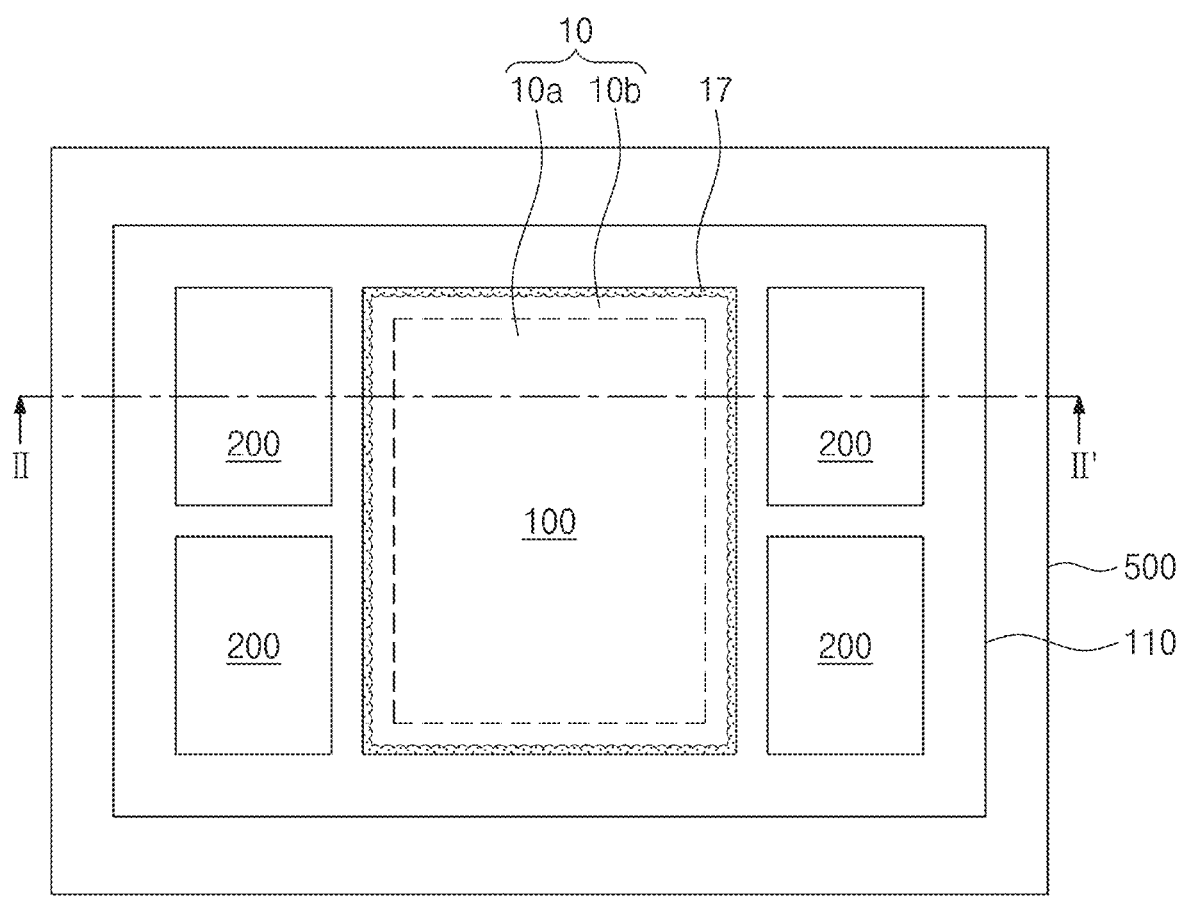
FIG. 4A illustrates a plan view showing a semiconductor package module according to an embodiment of inventive concepts.
Figure 4B:
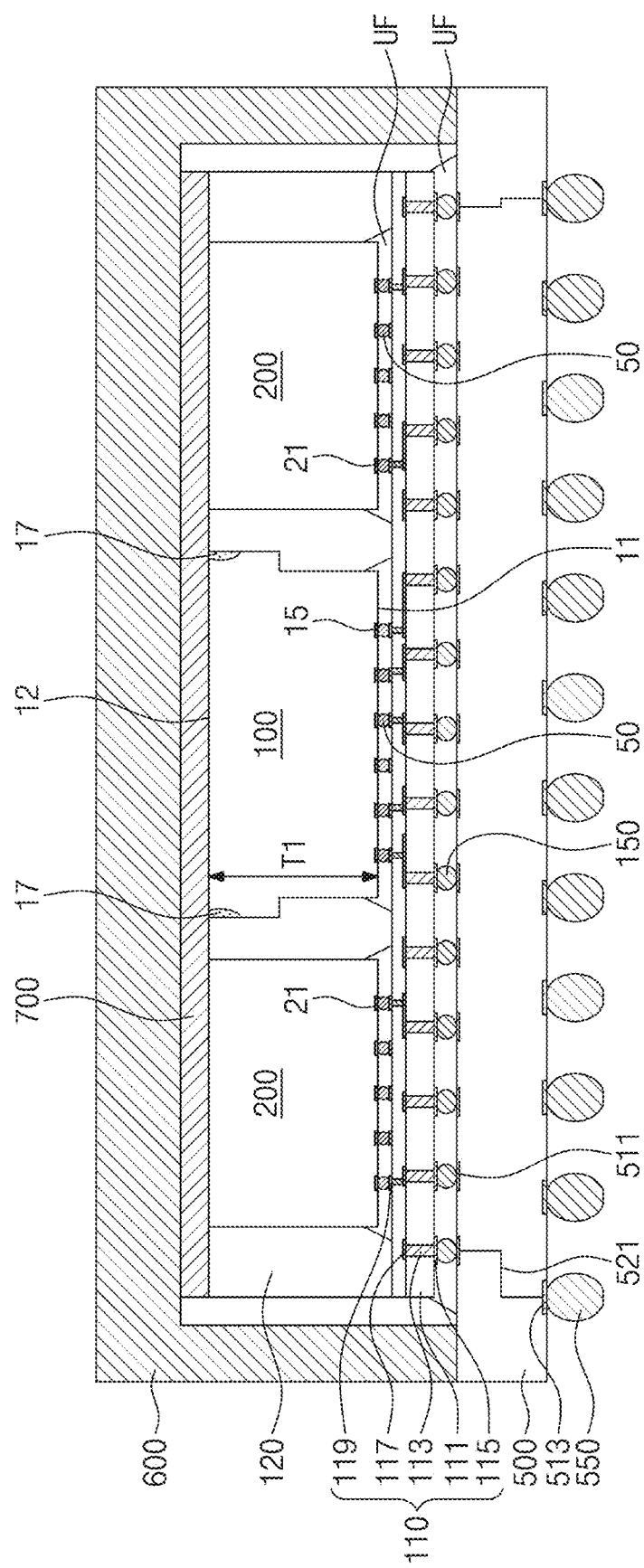
FIGS. 4B and 4C illustrate cross-sectional views taken along line II-II' of FIG. 4A, showing a semiconductor package module according to an embodiment of inventive concepts.
Figure 4C:
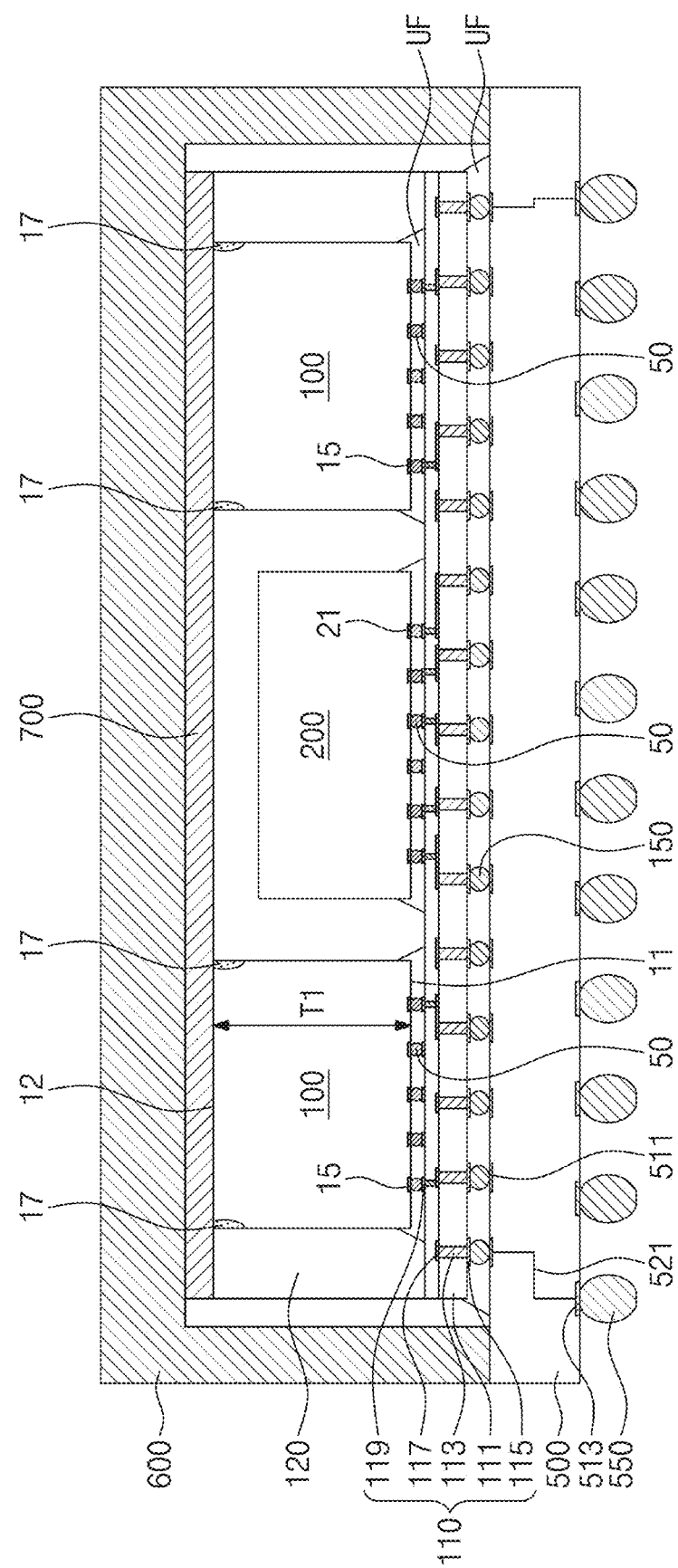

FIG. 4A illustrates a plan view showing a semiconductor package module according to an embodiment of inventive concepts. FIGS. 4B and 4C illustrate cross-sectional views taken along line II-II' of FIG. 4A, showing a semiconductor package module according to an embodiment of inventive concepts.

Referring to FIGS. 4A and 4B, a semiconductor package module may include a package substrate 500, a semiconductor package, and a heat radiation structure 600.

The package substrate 500 may be, for example, a printed circuit board, a flexible substrate, or a tape substrate. For example, the package substrate 500 may be one of a flexible printed circuit board, a rigid printed circuit board, and a combination thereof, each of which boards includes internal wiring lines formed therein.

The package substrate 500 may have a top surface and a bottom surface that face each other, and may include upper bonding pads 511, external bonding pads 513, and internal wiring lines 521. The upper bonding pads 511 may be arranged on the top surface of the package substrate 500, and the external bonding pads 513 may be arranged on the bottom surface of the package substrate 500. The upper bonding pads 511 may be electrically connected through the internal wiring lines 521 to the external bonding pads 513. External connection terminals 550 may be attached to the external bonding pads 513. The external connection terminals 550 may be arranged to constitute a ball grid array (BGA).

The semiconductor package may be disposed on the package substrate 500. The semiconductor package may include a connection substrate 110, a first semiconductor chip 100 on the connection substrate 110, and a plurality of second semiconductor chips 200 on the connection substrate 110.

Each of the first and second semiconductor chips 100 and 200 may have a first surface 11 and a second surface 12 that are opposite surfaces of the semiconductor chips 100 and 200 (e.g., first surface 11 is a top surface and second surface 12 is a bottom surface). First chip pads 15 may be disposed on the first surface 11 of the first semiconductor chip 100, and second chip pads 21 may be disposed on the first surface 11 of each second semiconductor chip 200.

The first semiconductor chip 100 may have features substantially the same as those of the semiconductor chip 10 discussed above with reference to FIGS. 1A and 1B. For example, the first semiconductor chip 100 may include a reforming layer 17 formed along an edge on the second surface 12 thereof.

The first semiconductor chip 100 may be electrically connected through the connection substrate 110 to the second semiconductor chips 200. The first semiconductor chip 100 may have a thickness T1 substantially the same as that of the second semiconductor chips 200. For example, each of the first and second semiconductor chips 100 and 200 may have a thickness ranging from about 700 µm to about 775 µm.

The second semiconductor chips 200 may be spaced apart from the first semiconductor chip 100 and disposed on the connection substrate 110. As discussed above with reference to FIG. 3, each of the second semiconductor chips 200 may include a plurality of memory chips stacked on the connection substrate 110, and the plurality of memory chips may be electrically connected to each other though through vias (see 25 of FIG. 3) and connection bumps 35. As discussed above with reference to FIG. 3, each of the second semiconductor chips 200 may include a reforming layer at an uppermost memory chip.

The semiconductor package may include a molding layer 120 on the connection substrate 110 and the molding layer 120 may surround sidewalls of the first and second semiconductor chips 100 and 200. The molding layer 120 may have a top surface substantially coplanar with those of the first and second semiconductor chips 100 and 200. In addition, the top surface of the molding layer 120 may be substantially coplanar with the reforming layer 17 of the first semiconductor chip 100.

The heat radiation structure 600 may include a thermally conductive material. The thermally conductive material may include a metallic material (e.g., copper and/or aluminum) or a carbon-containing material (e.g., graphene, graphite, and/or carbon nano-tubes). The heat radiation structure 600 may have relatively high thermal conductivity. For example, a single metal layer or a plurality of stacked metal layers may be used as the heat radiation structure 600. For another example, the heat radiation structure 600 may include a heat sink or a heat pipe. For another example, the heat radiation structure 600 may be configured to use water cooling.

A thermal conductive layer 700 may be interposed between the semiconductor package and the heat radiation structure 600. The thermal conductive layer 700 may be in contact with a top surface of the semiconductor package and a bottom surface of the heat radiation structure 600. The thermal conductive layer 700 may include a thermal interface material (TIM). The thermal interface material may include, for example, a polymer and thermal conductive particles. The thermal conductive particles may be distributed in the polymer. When the semiconductor package operates, heat produced from the semiconductor package may be transferred through the thermal conductive layer 700 to the heat radiation structure 600.

Referring to FIG. 4C, a semiconductor package module may include a semiconductor package mounted on a package substrate 500 as discussed above, and the semiconductor package may include a connection substrate 110, a plurality of first semiconductor chips 100 on the connection substrate 110, and a second semiconductor chip 200 on the connection substrate 110. As discussed above, each of the first semiconductor chips 100 may include a reforming layer 17 at an upper edge thereof. The reforming layer 17 may have a top surface substantially coplanar with those of the first semiconductor chips 100.

Each of the first semiconductor chips 100 may have features substantially the same as those of the semiconductor chip 10 discussed above with reference to FIGS. 1A and 1B. Alternatively, each of the first semiconductor chips 100 may have features substantially the same as those of the chip stack CST discussed above with reference to FIG. 3.

The second semiconductor chip 200 may be spaced apart from the first semiconductor chips 100 and disposed on the connection substrate 110. The second semiconductor chip 200 may have a thickness less than a thickness T1 of the first semiconductor chip 100.

On the connection substrate 110, a molding layer 120 may cover sidewalls of the first and second semiconductor chips 100 and 200, and may also cover a top surface of the second semiconductor chip 200. The molding layer 120 may have a top surface substantially coplanar with those of the first semiconductor chips 100 and also with that of the reforming layer 17.

Figure 5:
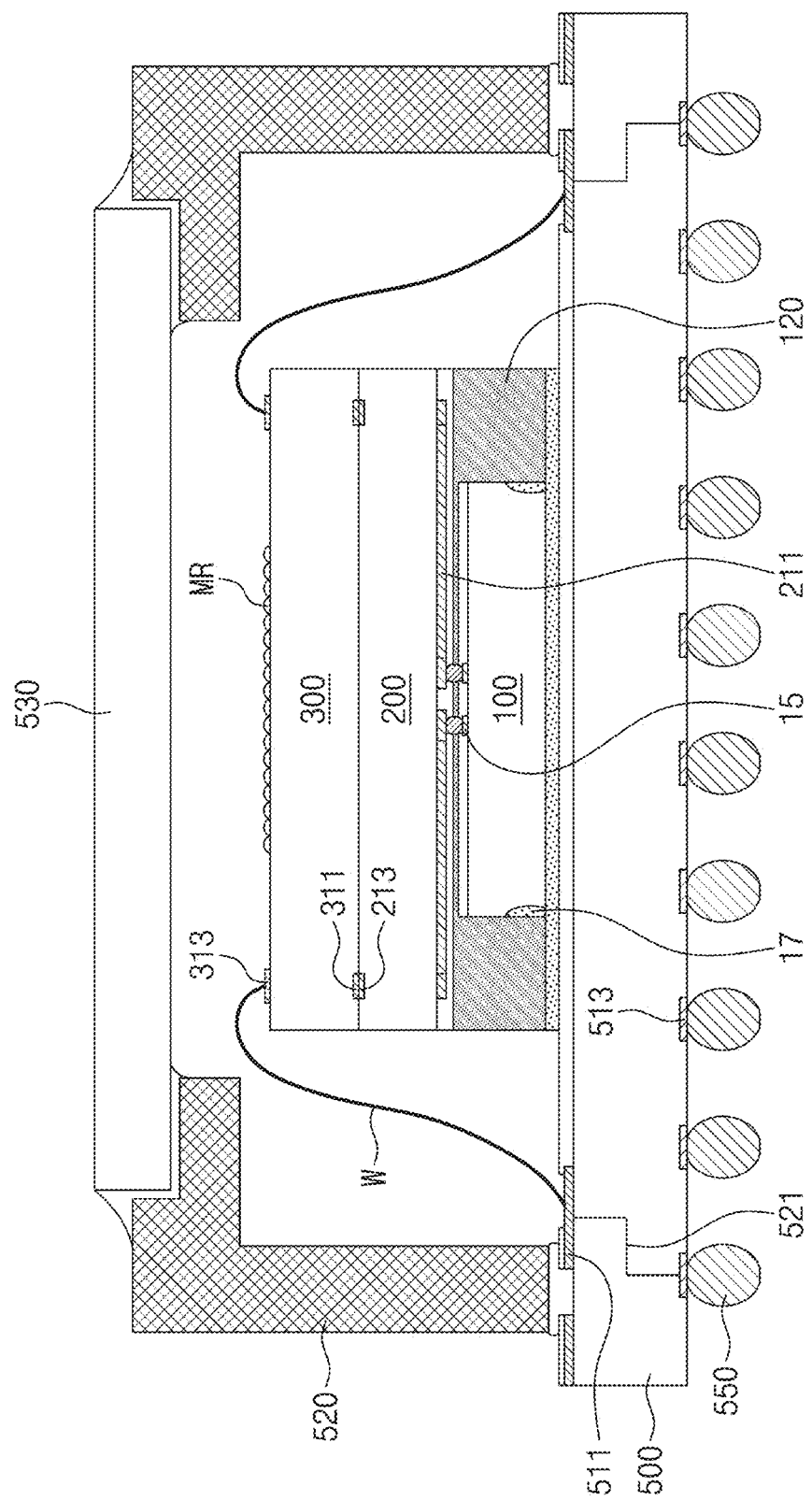
FIG. 5 illustrates a cross-sectional view showing a semiconductor package module according to an embodiment of inventive concepts.

FIG. 5 illustrates a cross-sectional view showing a semiconductor package module according to an embodiment of inventive concepts.

Referring to FIG. 5, a semiconductor package may be attached through an adhesive layer to a package substrate 500. The adhesive layer may include a non-conductive film (NCF), an anisotropic conductive film (ACF), a UV sensitive film, an instant adhesive, a thermo-curable adhesive, a laser-curable adhesive, a supersonic wave-curable adhesive, or a non-conductive paste (NCP).

As discussed above with reference to FIGS. 4A and 4B, the package substrate 500 may include upper bonding pads 511, external bonding pads 513, and internal wiring lines 521.

The semiconductor package may include a first semiconductor chip 100, a second semiconductor chip 200, and a third semiconductor chip 300 that are sequentially stacked. The first, second, and third semiconductor chips 100, 200, and 300 may have different functions from each other.

The first semiconductor chip 100 may be a logic chip or a memory chip. The first semiconductor chip 100 may have features the same as those of the semiconductor chip 10 discussed above with reference to FIGS. 1A and 1B. For example, as discussed above, the first semiconductor chip 100 may include a reforming layer 17 disposed along an edge thereof.

A molding layer 120 may cover a sidewall of the first semiconductor chip 100. The molding layer 120 may have a bottom surface substantially coplanar with that of the first semiconductor chip 100 and that of the reforming layer 17. The bottom surface of each of the molding layer 120 and the first semiconductor chip 100 may be attached through an adhesive to the package substrate 500.

The first semiconductor chip 100 may have a width less than that of the second semiconductor chip 200. The first semiconductor chip 100 may include chip pads 15 disposed on a top surface thereof. The chip pads 15 of the first semiconductor chip 100 may be connected through solder bumps to conductive pads of the second semiconductor chip 200.

The second semiconductor chip 200 may be a logic chip or a memory chip, and may have a different function from that of the first semiconductor chip 100. The second semiconductor chip 200 may have a top surface in contact with the third semiconductor chip 300 and a bottom surface in contact with the first semiconductor chip 100. A redistribution layer may be disposed on the bottom surface of the second semiconductor chip 200. The redistribution layer may include conductive pads, redistribution patterns 211 that connect the conductive pads, and a passivation layer that protects the conductive pads and the redistribution patterns 211. The second semiconductor chip 200 may include on its top surface a plurality of upper conductive pads 213 including copper (Cu).

The third semiconductor chip 300 may be, for example, an image sensor chip. The third semiconductor chip 300 may have a width substantially the same as that of the second semiconductor chip 200. The third semiconductor chip 300 may have a sidewall vertically aligned with that of the second semiconductor chip 200. The second and third semiconductor chips 200 and 300 may be bonded to each other. The third semiconductor chip 300 may include lower conductive pads 311 on a bottom surface thereof. The third semiconductor chip 300 may include on its top surface a plurality of upper conductive pads 313 and a micro-lens array MR. The upper conductive pads 313 of the third semiconductor chip 300 may be connected through bonding wires W to the upper bonding pads 511 of the package substrate 500.

A holder 520 may be disposed on the package substrate 500. The holder 520 may be spaced apart from the semiconductor package. The holder 520 may be attached through an adhesive to the package substrate 500.

A transparent cover 530 may be provided as being vertically spaced apart from the first semiconductor chip 100 of the semiconductor package, and the holder 520 may fix the transparent cover 530. The transparent cover 530 may be formed of transparent glass or plastic. The transparent cover 530 and the semiconductor package may be spaced apart from each other with an empty space therebetween.

FIGS. 6, 7A, 7B, 8A, 8B, 9A, 9B, and 10 illustrate cross-sectional and plan views showing a method of fabricating a semiconductor chip according to an embodiment of inventive concepts.

Figure 6:
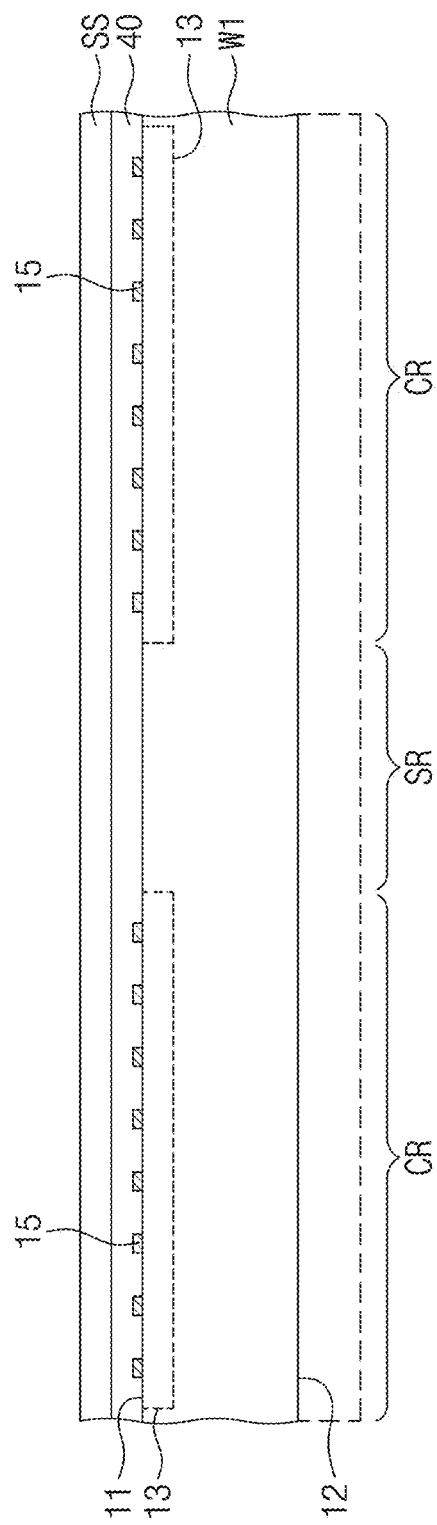
FIGS. 6, 7A, 7B, 8A, 8B, 9A, 9B, and 10 illustrate cross-sectional and plan views showing a method of fabricating a semiconductor chip according to an embodiment of inventive concepts.

Referring to FIG. 6, a first semiconductor substrate W1 may include chip regions CR, on which semiconductor integrated circuits 13 are formed, and may also include a scribe lane region SR that surrounds each of the chip regions CR. The chip regions CR may be two-dimensionally arranged along rows and columns. The first semiconductor substrate W1 may have a first surface 11 and a second surface 12 that are opposite surfaces of the substrate W (e.g., first surface 11 is a top surface and second surface 12 is a bottom surface).

The semiconductor integrated circuits 13 may be formed on the first surface 11 of the first semiconductor substrate W1. The semiconductor integrated circuits 13 may include a semiconductor memory device, such as dynamic random access memory (DRAM), static random access memory (SRAM), NAND Flash memory, and resistive random access memory (RRAM). Alternatively, the semiconductor integrated circuits 13 may include, for example, a microelectromechanical system (MEMS) device, an optoelectronic device, a central processing unit (CPU), a graphic processing unit (GPU), a mobile application, or a digital signal processor (DSP).

The first semiconductor substrate W1 may include chip pads 15 electrically connected to the semiconductor integrated circuits 13. A protective adhesive layer 40 may be used to attach a support substrate SS to the first surface 11 of the first semiconductor substrate W1. The support substrate SS may be one of a silicon wafer and a glass substrate each of which has an identical or similar size to that of the first semiconductor substrate W1. The protective adhesive layer 40 may cover the chip pads 15, and may prevent the chip pads 15 from being damaged or contaminated in a thinning process. Alternatively, a protective film covering the chip pads 15 may be attached to the first surface 11 of the first semiconductor substrate W1. The protective film may include a polyvinylchloride (PVC)-based polymer sheet and an acryl resin-based UV-curable adhesive layer.

After the attachment of the support substrate SS, a thinning process may be performed on the second surface 12 of the first semiconductor substrate W1. The thinning process may include a grinding process, a chemical mechanical polishing process, or an etching process. The thinning process may reduce a thickness of the first semiconductor substrate W1.

Figure 7A:
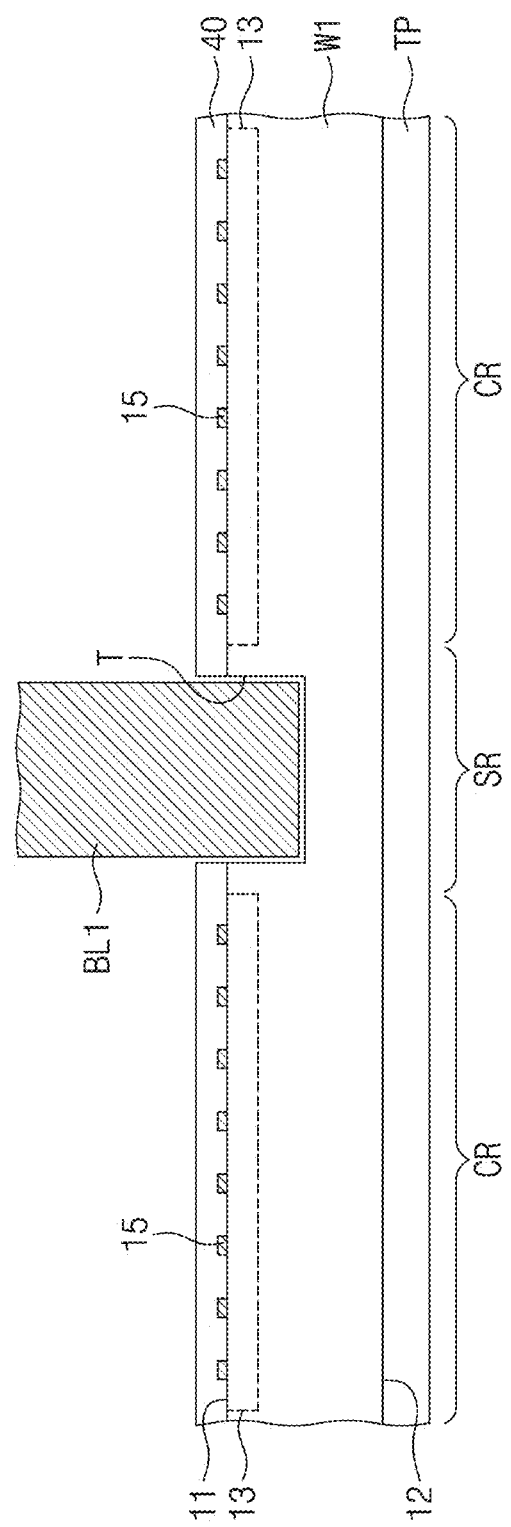
Figure 7B:
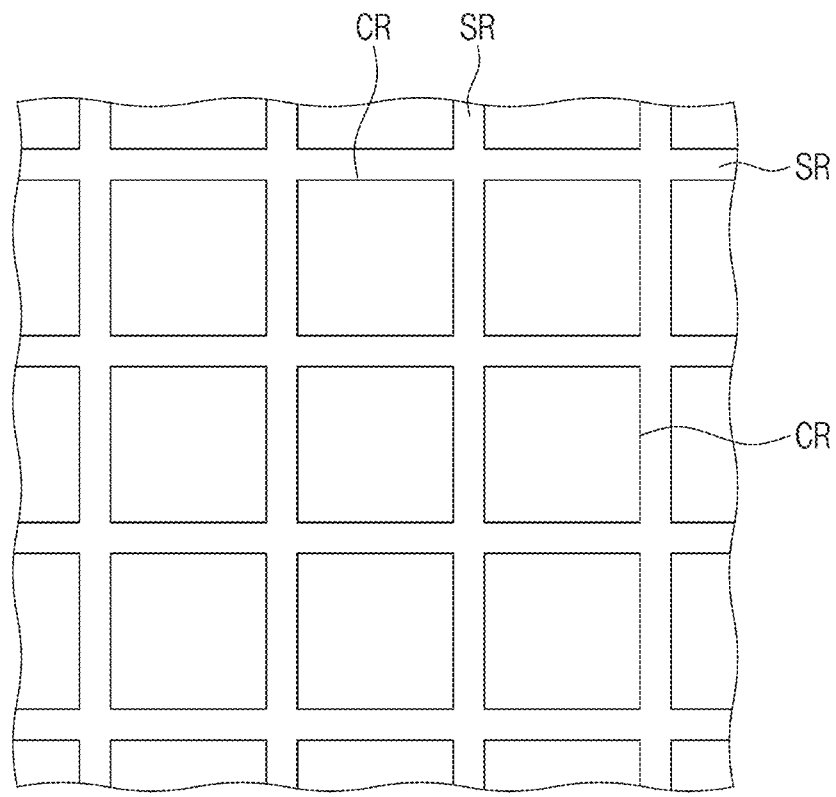

Referring to FIGS. 7A and 7B, after the thinning of the first semiconductor substrate W1, a sawing tape TP may be attached to the second surface 12 of the first semiconductor substrate W1. The sawing tape TP may have elasticity and may lose adhesiveness by heat or ultraviolet light.

After the attachment of the sawing tape TP, a first sawing process may be performed along the scribe lane region SR. The first sawing process may include cutting the first semiconductor substrate W1 with a first blade BL1 that has a first width. The first width of the first blade BL1 may be less than a distance between the chip regions CR, or a width of the scribe lane region SR.

After the first sawing process, on the scribe lane region SR, a trench T may be formed on the first surface 11 of the first semiconductor substrate W1. The trench T may have a depth less than a thickness of the thinned first semiconductor substrate W1. For example, the depth of the trench T may be less than half the thickness of the thinned first semiconductor substrate W1. The trench T may have a bottom surface spaced apart from the second surface 12 of the first semiconductor substrate W1.

Figure 8A:
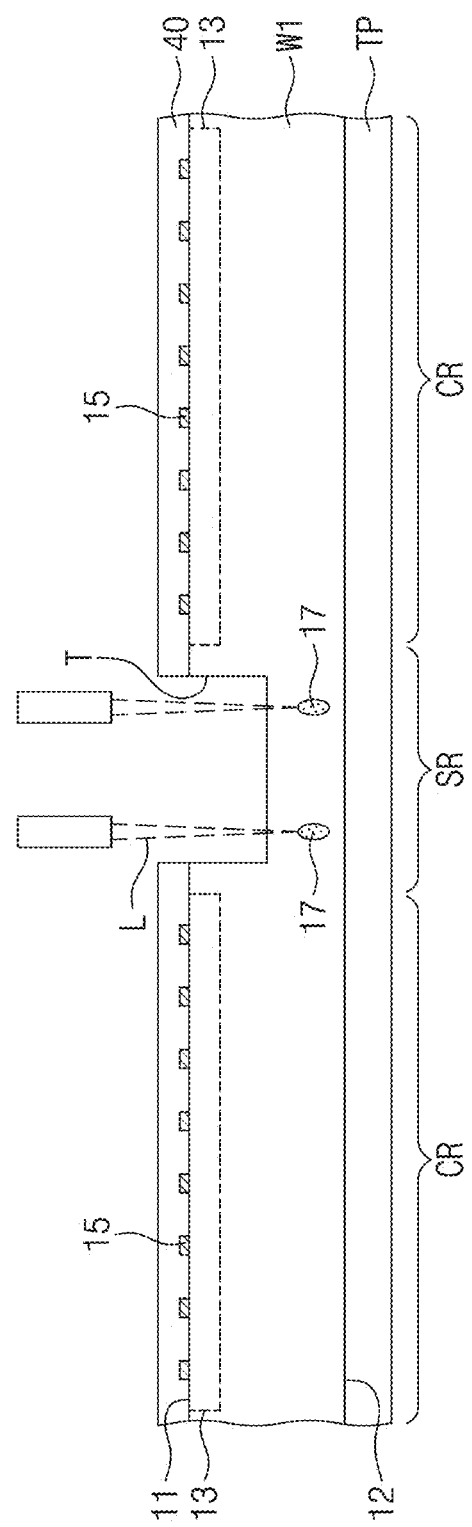
Figure 8B:
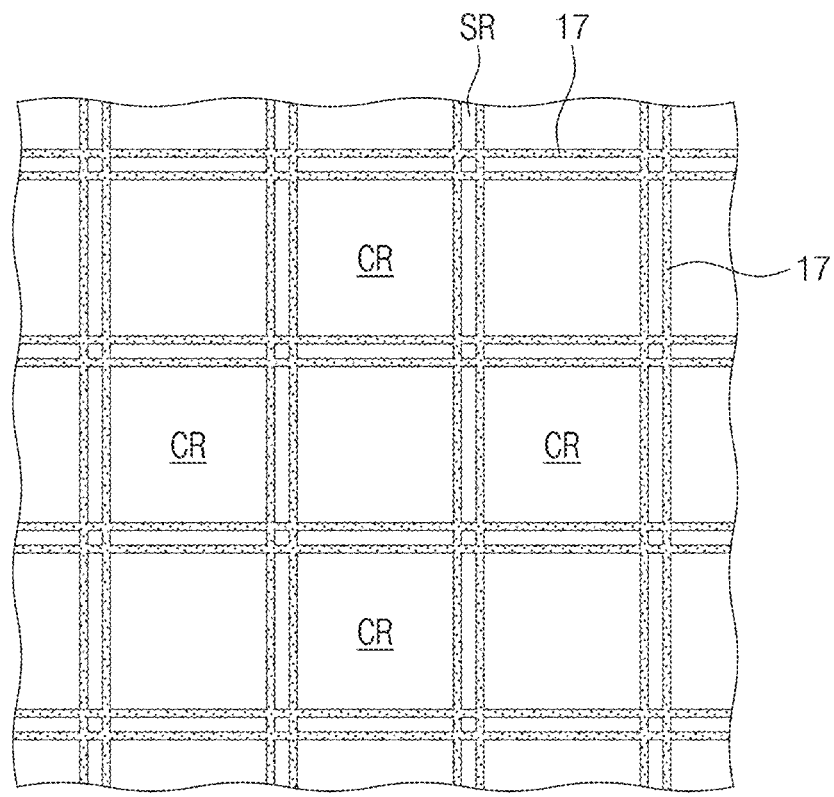

Referring to FIGS. 8A and 8B, a laser grooving process may be performed along the scribe lane region SR. The laser grooving process may include forming a reforming layer 17 by allowing the scribe lane region SR to receive a stealth laser L that passes through the first semiconductor substrate W1.

For example, the stealth laser L may be irradiated onto the first surface 11 of the first semiconductor substrate W1. The stealth laser L may be irradiated along a circumference of each chip region CR. The stealth laser L may be irradiated in a linear or zigzag shape along the scribe lane region SR. The stealth laser L may have a wavelength ranging from about 900 nm to about 1,700 nm, but inventive concepts are not limited thereto. The stealth laser L may pass through the first semiconductor substrate W1, and the reforming layer 17 may be formed at a position about 700 μm to about 800 μm distant from the first surface 11 of the first semiconductor substrate W1.

Below the trench T, the reforming layer 17 may be spaced apart from the second surface 12 of the first semiconductor substrate W1. The first semiconductor substrate W1 may physical characteristics that are partially changed at the reforming layer 17 onto which the stealth laser L is irradiated, and may exhibit reduced physical strength at the reforming layer 17. For example, the reforming layer 17 may include amorphous silicon.

Figure 9A:
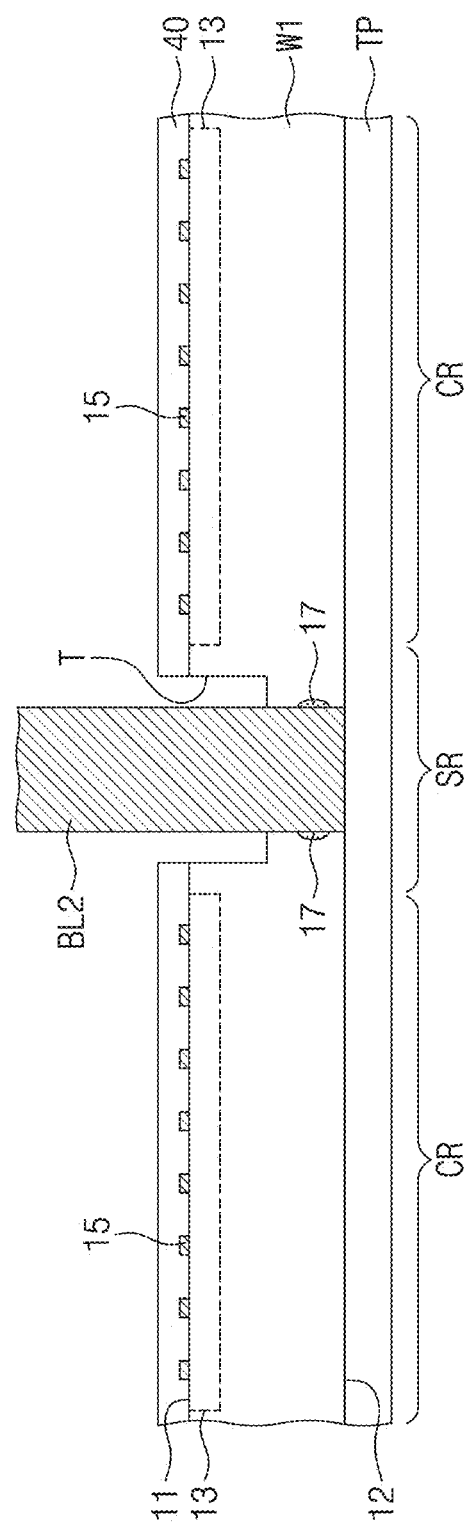
Figure 9B:
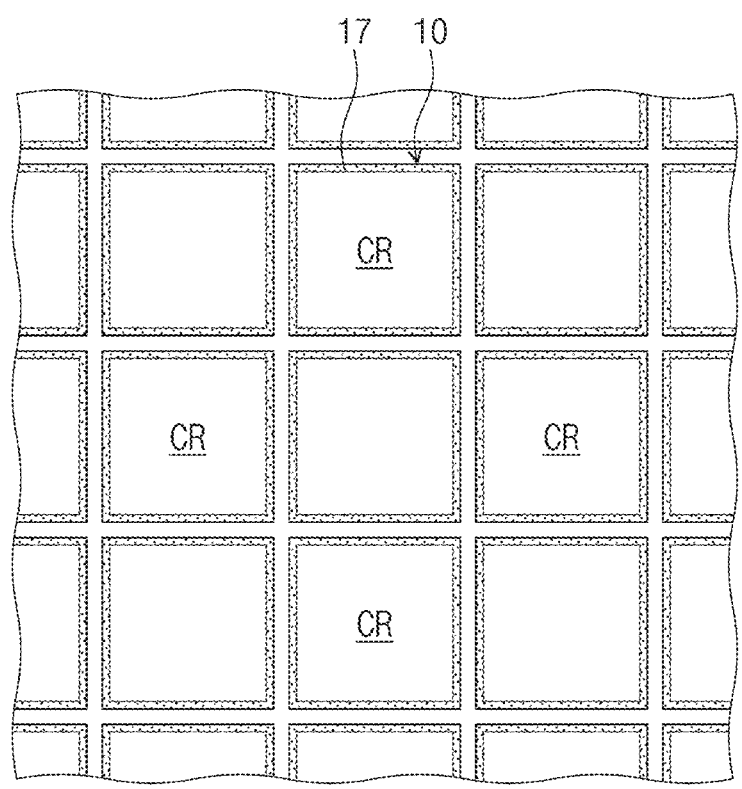

Referring to FIGS. 9A and 9B, after the formation of the reforming layer 17, a second sawing process may be performed along the scribe lane region SR, and thus the chip regions CR may be individually separated from each other. The second sawing process may cut the first semiconductor substrate W1 along the trench T with a second blade BL2 whose width is less than that of the first blade BL1.

Figure 10:
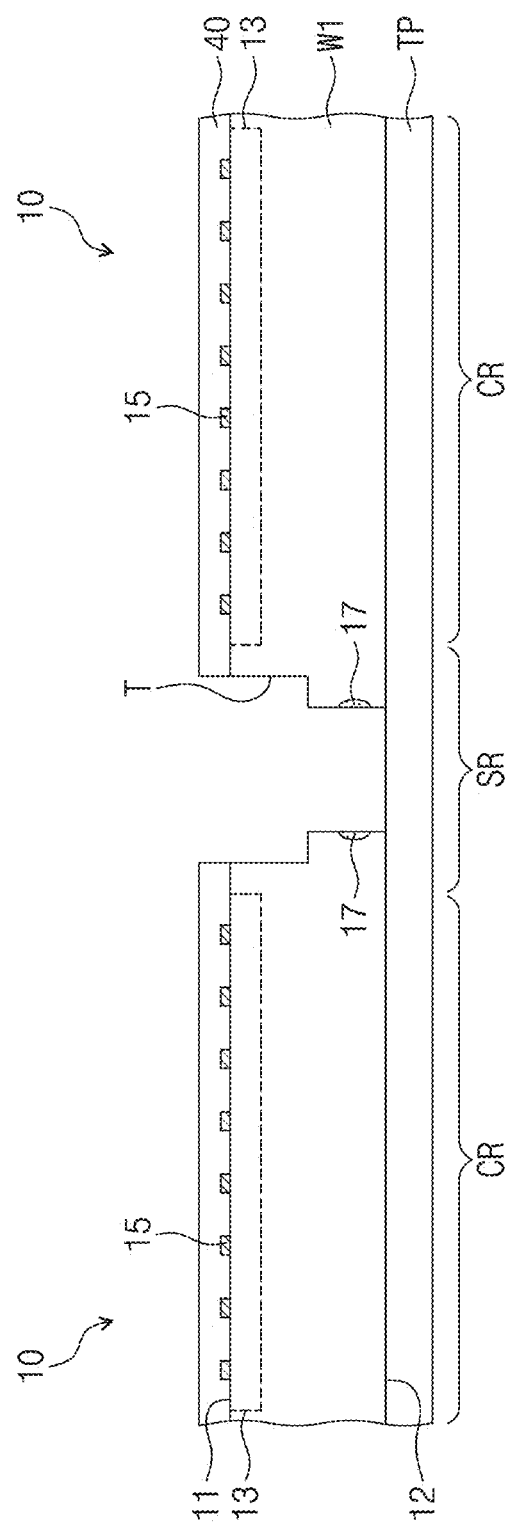

Accordingly, as shown in FIG. 10, the chip regions CR of the first semiconductor substrate W1 may be separated into a plurality of semiconductor chips 10 on the sawing tape TP. Each semiconductor chip 10 may include the reforming layer 17 at an edge region around a circuit region, and the reforming layer 17 may be exposed on a sidewall of each semiconductor chip 10.

The first and second sawing processes may cause each semiconductor chip 10 to have a stepwise sidewall. For example, the semiconductor chip 10 may have a first width at the first surface 11, and may also have at the second surface a second width greater than the first width.

Figure 11:
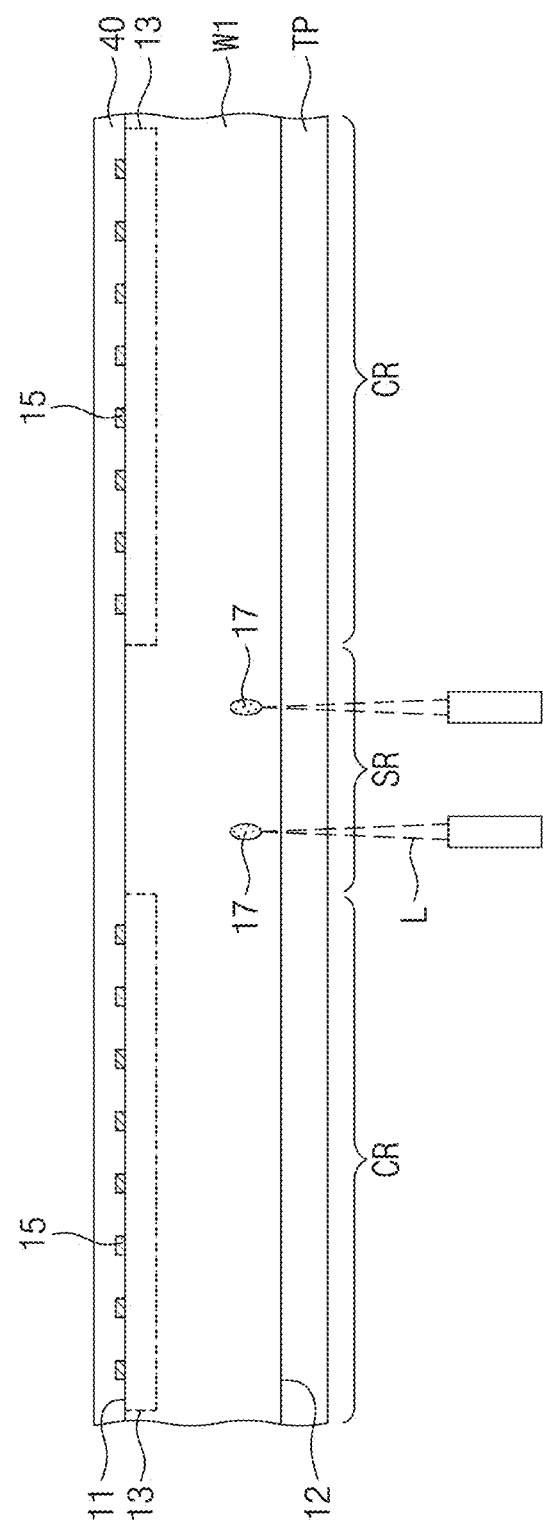
FIGS. 11 and 12 illustrate cross-sectional views showing a method of fabricating a semiconductor chip according to an embodiment of inventive concepts.
Figure 12:
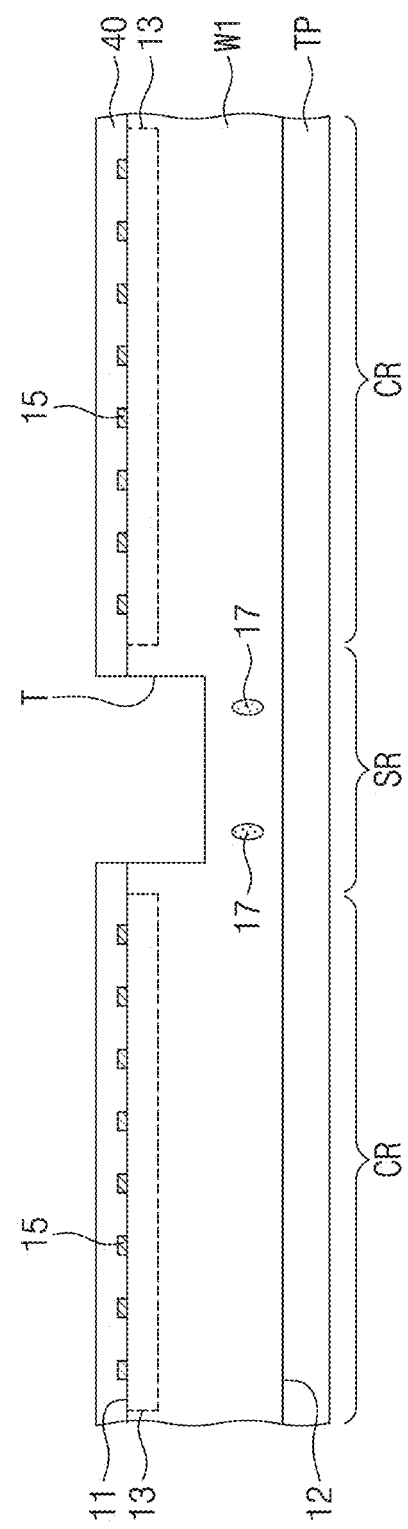

FIGS. 11 and 12 illustrate cross-sectional views showing a method of fabricating a semiconductor chip according to an embodiment of inventive concepts.

Referring to FIG. 11, as discussed above with reference to FIG. 6, after the thinning process is performed on the second surface 12 of the first semiconductor substrate W1, a sawing tape TP may be attached to the second surface 12 of the first semiconductor substrate W1.

Afterwards, the second surface 12 of the first semiconductor substrate W1 may undergo a laser grooving process performed along a circumference of each chip region CR. For example, the second surface 12 of the first semiconductor substrate W1 may receive a stealth laser L that passes through the sawing tape TP. Therefore, a reforming layer 17 may be formed in the first semiconductor substrate W1. The reforming layer 17 may be formed closer to the second surface 12 than to the first surface 11 of the first semiconductor substrate W1. The stealth laser L may be irradiated onto a position about 70 μm to about 100 μm distant from the second surface 12 of the first semiconductor substrate W1.

Referring to FIG. 12, after the formation of the reforming layer 17, as discussed above, a first sawing process may be performed to form a trench T on the scribe lane region SR. Thereafter, a second sawing process may be performed such that the chip regions CR of the first semiconductor substrate W1 are individually separated from each other.

FIGS. 13 to 17 illustrate cross-sectional views showing a method of fabricating a semiconductor package according to an embodiment of inventive concepts.

Figure 13:
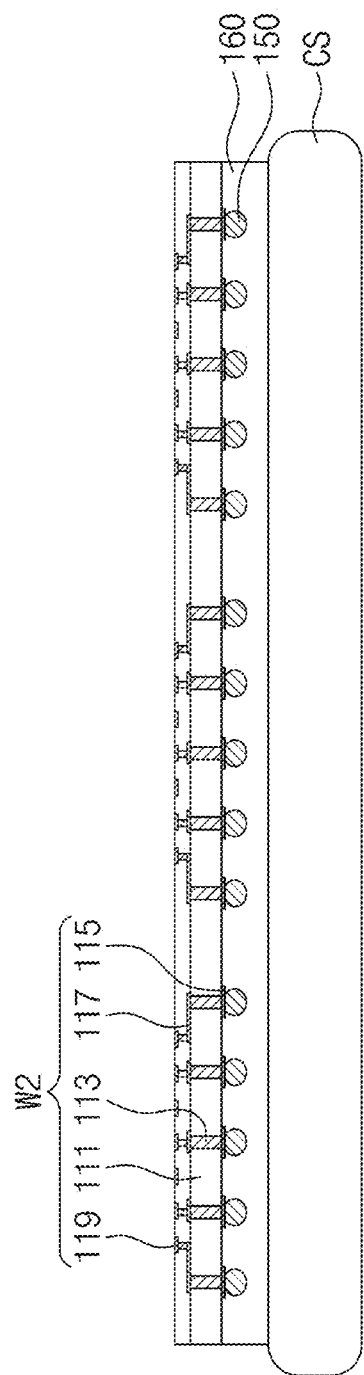
FIGS. 13 to 17 illustrate cross-sectional views showing a method of fabricating a semiconductor package according to an embodiment of inventive concepts.

Referring to FIG. 13, a second semiconductor substrate W2 may be provided on a carrier substrate CS. An adhesive may be used to attach the second semiconductor substrate W2 to the carrier substrate CS.

The second semiconductor substrate W2 may have chip regions and a scribe lane region between the chip regions. The second semiconductor substrate W2 may include a base substrate 111, a wiring line layer, through vias 113, connection lines 117, lower pads 115, and upper pads 119.

The wiring line layer may be formed on a top surface of the second semiconductor substrate W2, and may include bonding pads and redistribution patterns that connect the through vias 113 to the bonding pads. The lower pads 115 and the upper pads 119 may be respectively disposed on a bottom surface and a top surface of the base substrate 111. The lower pads 115 may be electrically connected to the upper pads 119 through the through vias 113 and the connection lines 117.

Lower connection terminals 150 may be attached to the lower pads 115 of the base substrate 111, and the lower connection terminals 150 may be electrically connected to the upper pads 119 through the through vias 113 and the connection lines 117. The lower connection terminals 150 may be solder balls formed of tin, lead, and/or copper.

The carrier substrate CS and the second semiconductor substrate W2 may be provided therebetween an adhesive mold 160 that protects the lower connection terminals 150 and attaches the second semiconductor substrate W2 to the carrier substrate CS.

Figure 14:
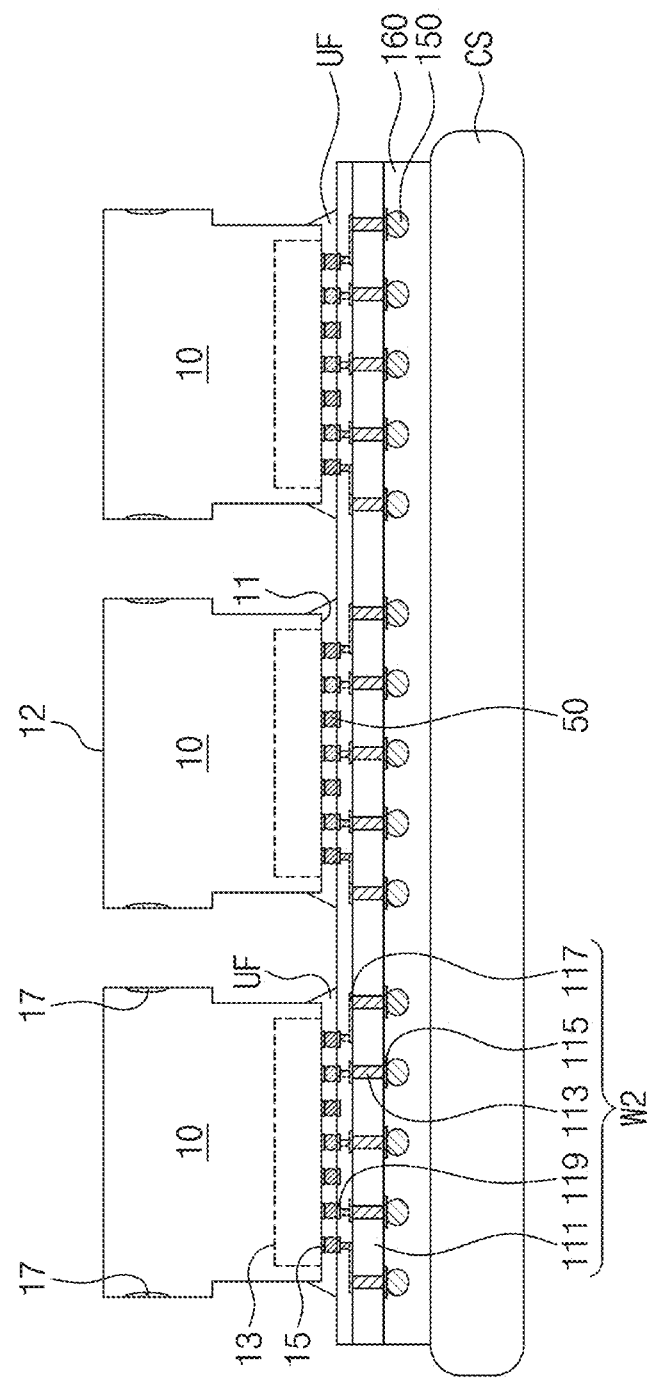

Referring to FIG. 14, semiconductor chips 10 may be attached through connection terminals 50 to corresponding chip regions of the second semiconductor substrate W2. The semiconductor chips 10 may be two-dimensionally attached along a plurality of rows and columns on the second semiconductor substrate W2.

For example, each of the semiconductor chips 10 may include semiconductor integrated circuits 13 adjacent to a first surface 11 thereof, and may also include chip pads 15 disposed on the first surface 11. The semiconductor chips 10 may be disposed to allow the chip pads 15 to face the second semiconductor substrate W2. The chip pads 15 of the semiconductor chips 10 may be connected through the connection terminals 50 to the upper pads 119 of the second semiconductor substrate W2.

As discussed above, each of the semiconductor chips 10 may include a reforming layer 17 at a sidewall thereof. In addition, each of the semiconductor chips 10 may have a width that is less at the first surface 11 than at the second surface 12, and may also have a stepwise sidewall.

After the attachment of the semiconductor chips 10, an under-fill layer UF may fill between the connection terminals 50 on each chip region.

Figure 15:
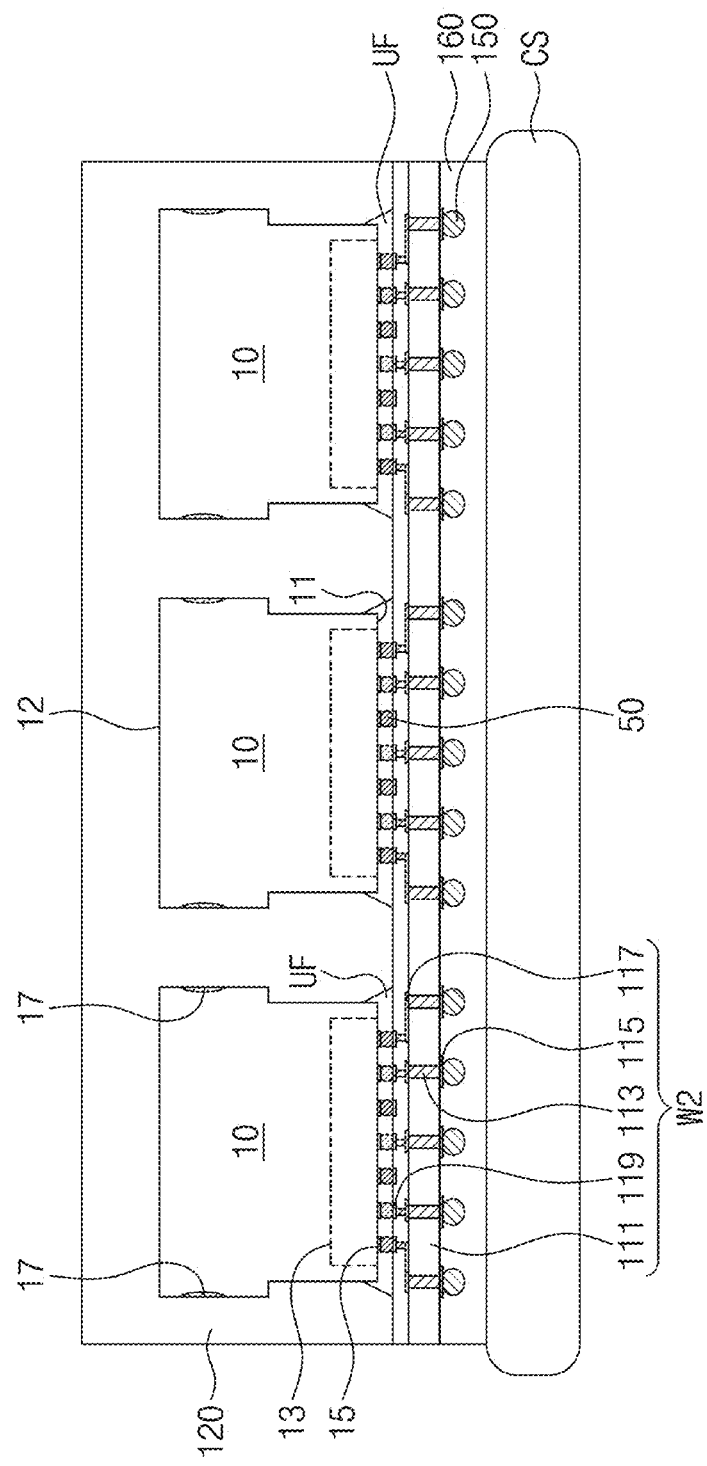

Referring to FIG. 15, a molding layer 120 may be formed on the second semiconductor substrate W2, covering top surfaces of the semiconductor chips 10. The molding layer 120 may be thicker than each of the semiconductor chips 10, and may fill between the semiconductor chips 10. The molding layer 120 may include a dielectric polymer, such as epoxy molding compound (EMC).

Figure 16:
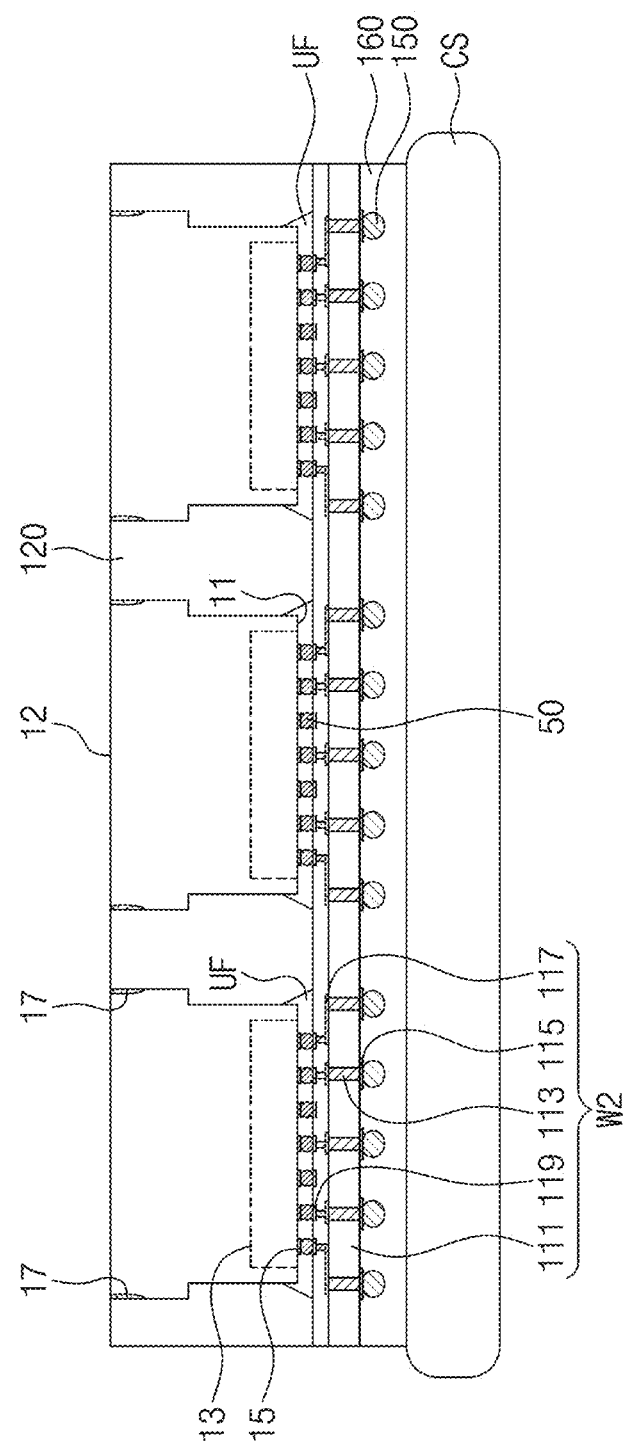

Referring to FIG. 16, a thinning process may be performed on the molding layer 120. The thinning process may include a grinding process, a chemical mechanical polishing process, or an etching process. When a grinding process is performed, the reforming layers 17 formed in the semiconductor chips 10 may be used as a grinding stop layer. For example, when a grinding process is performed on the molding layer 120, the semiconductor chips 10 may be partially removed, and the reforming layers 17 may be exposed.

According to an embodiment, when a thinning process is performed on the molding layer 120, the thinning process may terminate at the reforming layer 17 on an edge region of the semiconductor chip 10, which may result in a reduction in damage to the semiconductor chips 10 and/or in the occurrence of particles at the semiconductor chips 10.

Figure 17:
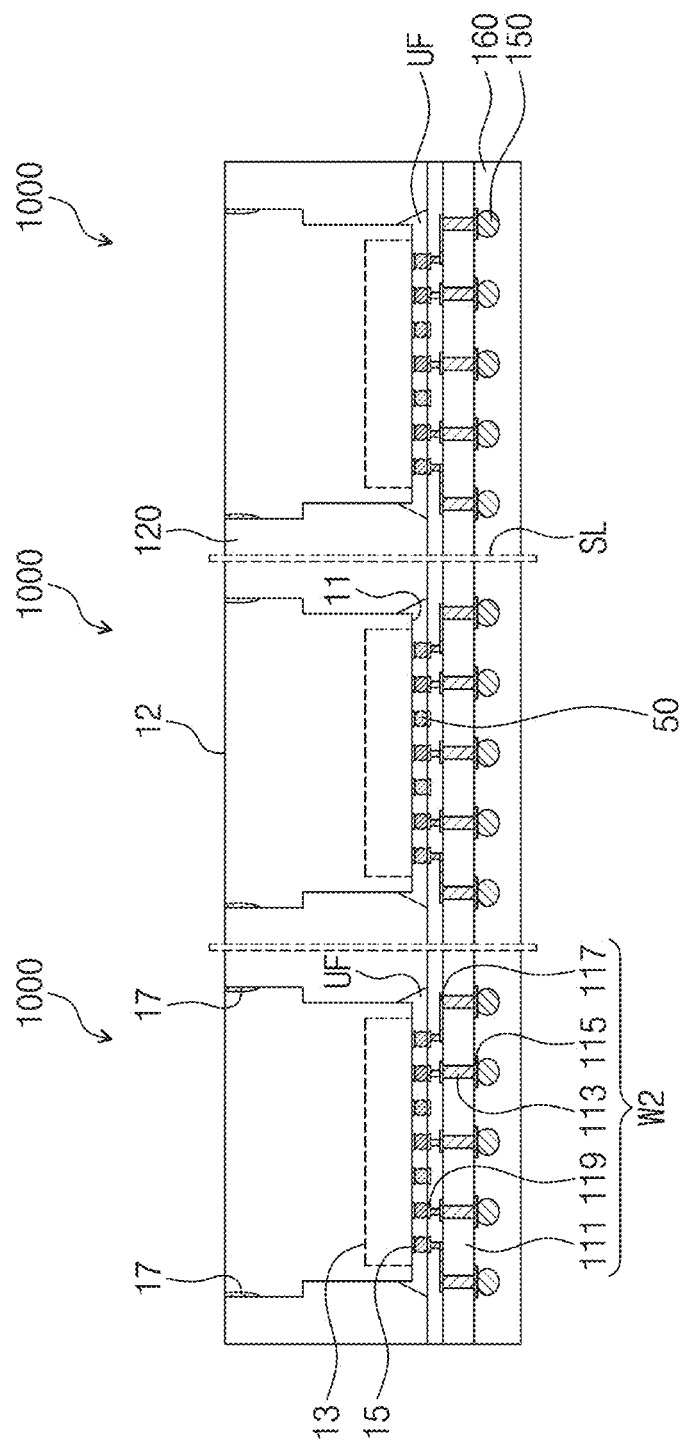

Referring to FIG. 17, the molding layer 120 and the second semiconductor substrate W2 may be cut along a scribe lane SL For example, a cutting process may be performed such that the chip regions of the second semiconductor substrate W2 are individually separated from each other to form a plurality of semiconductor packages 1000. The cutting process may use a sawing wheel or a laser.

According to an embodiment of inventive concepts, when a thinning process is performed on a molding layer, the thinning process may terminate at a reforming layer on an edge region of a semiconductor chip, which may result in a reduction in damage to the semiconductor chip and/or in the occurrence of particles at the semiconductor chip.

Although inventive concepts have been described in connection with an embodiment of inventive concepts illustrated in the accompanying drawings, it will be understood to those skilled in the art that various changes and modifications may be made without departing from the technical spirit and essential feature of inventive concepts. It will be apparent to those skilled in the art that various substitution, modifications, and changes may be thereto without departing from the scope and spirit of inventive concepts.

What is claimed is:

1. A semiconductor package, comprising:
a semiconductor chip on a substrate, the semiconductor chip including a circuit region and an edge region around the circuit region; and
a molding layer on the substrate and covering a sidewall of the semiconductor chip,
wherein the semiconductor chip includes a reforming layer on the edge region, and
wherein a top surface of the reforming layer is substantially coplanar with a top surface of the molding layer.

2. The semiconductor package of claim 1, wherein the reforming layer is disposed at a portion of the sidewall of the semiconductor chip.

3. The semiconductor package of claim 1, wherein the molding layer is in contact with a sidewall of the reforming layer.

4. The semiconductor package of claim 1, wherein the reforming layer comprises amorphous silicon.

5. The semiconductor package of claim 1, wherein the semiconductor chip has a first surface and a second surface that face each other,
wherein the semiconductor chip includes a plurality of chip pads that are disposed on the first surface and are connected to the substrate, and
wherein the top surface of the molding layer is substantially coplanar with the second surface of the semiconductor chip.

6. The semiconductor package of claim 1, wherein the semiconductor chip has a first surface and a second surface that face each other, wherein the semiconductor chip includes a plurality of chip pads that are disposed on the first surface and are connected to the substrate, and wherein the reforming layer is substantially coplanar with the second surface.

7. The semiconductor package of claim 6, wherein the semiconductor chip includes:

a first part adjacent to the first surface and having a first width; and a second part adjacent to the second surface and having a second width greater than the first width.

8. The semiconductor package of claim 1, wherein a sidewall of the molding layer is aligned with a sidewall of the substrate.

9. The semiconductor package of claim 1, wherein the semiconductor chip has a thickness ranging from about 700 µm to about 775 µm.

10. The semiconductor package of claim 1, wherein the substrate includes a plurality of upper pads, a plurality of lower pads, and a plurality of through vias that connect the upper pads to the lower pads.

11. The semiconductor package of claim 10, further comprising:

a plurality of first connection terminals between the upper pads of the substrate and a plurality of chip pads of the semiconductor chip; and a plurality of second connection terminals attached to the lower pads of the substrate, wherein the first connection terminals are smaller than the second connection terminals.

12. A semiconductor package, comprising:

a package substrate;

a connection substrate on the package substrate;

a chip stack on the connection substrate, the chip stack including a plurality of first semiconductor chips that are vertically stacked;

a second semiconductor chip on the connection substrate and spaced apart from the chip stack; and a molding layer on the connection substrate, the molding layer covering a sidewall of the chip stack and a sidewall of the second semiconductor chip, wherein the second semiconductor chip includes a circuit region and an edge region around the circuit region, wherein the second semiconductor chip includes a reforming layer at a portion of a top surface thereof on the edge region, and wherein a top surface of the molding layer is substantially coplanar with a top surface of the reforming layer.

13. The semiconductor package of claim 12, wherein the top surface of the molding layer is substantially coplanar with a top surface of the chip stack.

14. The semiconductor package of claim 12, wherein the reforming layer is disposed at a portion of the sidewall of the second semiconductor chip.

15. The semiconductor package of claim 12, wherein the second semiconductor chip includes a lower portion adjacent to the connection substrate and an upper portion on the lower portion, wherein the lower portion has a first width, and wherein the upper portion has a second width greater than the first width.

16. The semiconductor package of claim 12, wherein the connection substrate includes a plurality of upper pads, a plurality of lower pads, and a plurality of through vias that connect the upper pads to the lower pads, wherein the second semiconductor chip includes a plurality of chip pads on a bottom surface thereof, the chip pads being connected to the upper pads.

17. The semiconductor package of claim 16, further comprising:

a plurality of first connection terminals connected between the upper pads and the chip pads;

a plurality of second connection terminals connected between the connection substrate and the package substrate, wherein the first connection terminals are smaller than the second connection terminals.

18. The semiconductor package of claim 12, wherein the connection substrate includes a connection line that connects the chip stack to the second semiconductor chip.

19. The semiconductor package of claim 12, further comprising a heat radiation structure on the molding layer, the heat radiation structure covering a top surface of the chip stack and a top surface of the second semiconductor chip.

20. The semiconductor package of claim 12, wherein an uppermost one of the first semiconductor chips includes an upper reforming layer at a portion of a top surface of the uppermost one of the first semiconductor chips.

* * * * *